(12) United States Patent
Apostolidou et al.

(10) Patent No.: US 8,570,101 B2
(45) Date of Patent: Oct. 29, 2013

(54) VARIABLE DUTY CYCLE GENERATION FOR OUT-PHASING AND PWM POWER AMPLIFIERS

(75) Inventors: Melina Apostolidou, Enschede (NL); Mark Pieter Van Der Heijden, Den Bosch (NL); Mustafa Acar, Eindhoven (NL)

(73) Assignee: NXP B.V., Eindhoven (NL)

( * ) Notice: Subject to any disclaimer, the term of this patent is extended or adjusted under 35 U.S.C. 154(b) by 252 days.

(21) Appl. No.: 13/128,197

(22) PCT Filed: Nov. 6, 2009

(86) PCT No.: PCT/IB2009/054935
§ 371 (c)(1),
(2), (4) Date: May 6, 2011

(87) PCT Pub. No.: WO2010/052668
PCT Pub. Date: May 14, 2010

(65) Prior Publication Data
US 2011/0216818 A1    Sep. 8, 2011

(30) Foreign Application Priority Data

Nov. 10, 2008    (EP) .................................... 08168729

(51) Int. Cl.
*H03F 3/38* (2006.01)
(52) U.S. Cl.
USPC ....... 330/10; 330/124 R; 330/300; 330/207 A
(58) Field of Classification Search
USPC ..................... 330/10, 124 R, 207 A; 375/300
See application file for complete search history.

(56) References Cited

U.S. PATENT DOCUMENTS 7,593,480 B2    9/2009 Udagawa et al.
(Continued)

FOREIGN PATENT DOCUMENTS

CN    1930784 A    3/2007
JP    2002-158543 A    5/2002
(Continued)

OTHER PUBLICATIONS

Chireix, H. "High Power Out Phasing Modulation", Proc. of the Institute of Radio Engineers, vol. 23, No. 11, pp. 1370-1392 (Nov. 1935).

(Continued)

*Primary Examiner* — Patricia Nguyen (57) ABSTRACT

Power reduction in transmitters is very important. One method to realize reduction is to make use of switching power amplifiers (PA) that have a better efficiency. Switching PA concepts are only possible in combination with suitable modulation methods like pulse width modulation (PWM) and out-phasing concepts. However, PWM and out-phasing concepts rely on accurate phase control and duty cycle of the signals. Digitally generation of signals of variable duty cycles and phase is proposed without sacrificing their accuracy. Accordingly, a out-phasing power amplifier arrangement is disclosed, where the generation of the out-phasing angle ($\theta$) and duty cycles ($d_1$ and $d_2$) are controlled by a set of n-bit digital input words (D1, D2, D3, D4). The baseband phase information ($\phi(t)$) is phase modulated back to radio frequency and used as the clock signal of digital circuitry for phase and duty cycle generation after being frequency multiplied by $2^{n-1}$. The resolution of the out-phasing angle and of the duty cycle is $2\pi/2^n$ and $2\pi/2^{n-1}$ equivalently. The resolution of the phase information $\phi$ is dependent on the PM realization.

10 Claims, 6 Drawing Sheets (56) References Cited

U.S. PATENT DOCUMENTS

| | | |
|---|---|---|
| 8,269,555 B2 | 9/2012 | van der Heijden et al. |
| 2005/0271161 A1 | 12/2005 | Staszewski et al. |
| 2006/0291589 A1 | 12/2006 | Eliezer et al. |
| 2011/0044404 A1 | 2/2011 | Vromans |
| 2011/0051842 A1 | 3/2011 | Van Der Heijden et al. |

FOREIGN PATENT DOCUMENTS

| | | |
|---|---|---|
| JP | 2003-018026 A | 1/2003 |
| JP | 2007-005956 A | 1/2007 |
| WO | 01/45205 A2 | 6/2001 |
| WO | 2007/106460 A2 | 9/2007 |

OTHER PUBLICATIONS

Cox, D. "Linear Amplification with Nonlinear Components", IEEE Trans. on Communications, pp. 1942-1945 (Dec. 1974).
Crips, S.. "Advanced Techniques in RF Power Amplifiers Design", Section 2.2.3, Artech House, 11 pages (2002).
Mohanavelu, R., et al. "A Novel 40-GHz Flip-Flop-Based Frequency Divider in 0.18 μm CMOS", Proc. of ESSCIRC, pp. 185-188 (2005).
Kim, K-W., et al. "A 600MHz CMOS OFDM LINC Transmitter with a 7 Bit Digital Phase Modulator", 20008 IEEE Radio Frequency Integrated Circuits Symp., pp. 667-680 (2008).
Heidari, M., et al. "All-Digital Out-Phasing Modulator for a Software-Defined Transmitter", IEEE Symp. on VLSI Circuits, pp. 98-99 (Jun. 18, 2008).
International Search Report and Written Opinion for Int'l. Patent Application No. PCT/IB2009/054935 (Mar. 12, 2010).

VARIABLE DUTY CYCLE GENERATION FOR OUT-PHASING AND PWM POWER AMPLIFIERS

FIELD OF THE INVENTION

The invention concerns in general out-phasing power amplifiers, in particular with pulse width modulated (PWM) out-phased signals having variable duty cycle.

BACKGROUND OF THE INVENTION

Mobile, in particular wireless communication is broadly used in several fields of applications, e.g. in the home, public or office area, as well as for any kind of communication, e.g. speech, data, and/or multi-media communication. Basically, such applications are confronted with two major problems.

As a matter of fact, available bandwidth for transmitting information is limited due to the general shortage of available spectrum. In this regard, it is well known to modulate both the amplitude and the phase of the carrier to reduce required bandwidth. For instance, systems, in which the amplitude and the phase are modulated, i.e. which process wide-band complex envelope signals, are EDGE, UMTS (WCDMA), HSxPA, WiMAX (OFDM) and 3G-LTE (OFDM). However, amplifying amplitude modulated carriers without distortion in the transmitter output stage imposes significant linearity constraints on the output stage amplifier.

Further, power efficiency of mobile transmitters is important, since mobile terminals in wireless communication are typical portable and as such, usually battery powered. In mobile terminals, the output stage of the transmitter unit is usually the largest power consumer of the whole device. Consequently, any improvement in this stage with respect to power efficiency is appreciated. Known efficient power amplifiers topologies or circuit arrangements are, for instance, class-C and class-E radio frequency (RF) amplifiers in which the active output amplification devices conduct current only at the time, e.g. in case of transistors, when the collector-emitter voltage is at its lowest value. Unfortunately, class-C and class-E amplifiers are very nonlinear and thus, introduce substantial distortion of the amplitude modulation.

Linear Amplification using Nonlinear Components (LINC) is a well-known concept for high efficient linear power amplification of RF signals. Detailed information may, for instance, be gathered from S. C. Crips, "Advanced Techniques in RF Power Amplifiers Design", Artech House 2002, or from D. C. Cox in "Linear Amplification with Nonlinear Components", IEEE Transactions on Communications, December 1974, pp. 1942-1945.

WO 01/45205 discloses transmission of multiple radio channel frequency signals modulated with respective information modulation from a common antenna at multiple radio frequencies. Multiple modulators are provided, a respective one of which corresponds to a respective one of the radio channel frequencies. Each modulator generates at least one constant amplitude, phase modulated drive signal at the corresponding radio channel frequency from the respective information modulation, such that the at least one constant amplitude, phase modulated drive signal corresponds to the information modulation for the corresponding radio frequency. At least one saturated power amplifier is provided for each of the at least one constant amplitude, phase modulated drive signals. A respective saturated power amplifier is responsive to the corresponding constant amplitude, phase modulated drive signal, to produce a corresponding amplified output signal at an output thereof. A coupling network connects the outputs of the saturated power amplifiers in series, to produce a combined signal that is applied to the common antenna, such that the common antenna radiates the radio channel frequency signals that are modulated with the respective information modulation. In some embodiments, at least two constant amplitude phase modulated drive signals are provided at the corresponding radio channel frequency, such that the at least two constant amplitude, phase modulated drive signals correspond to the information modulation for the corresponding radio frequency.

Figure 1:
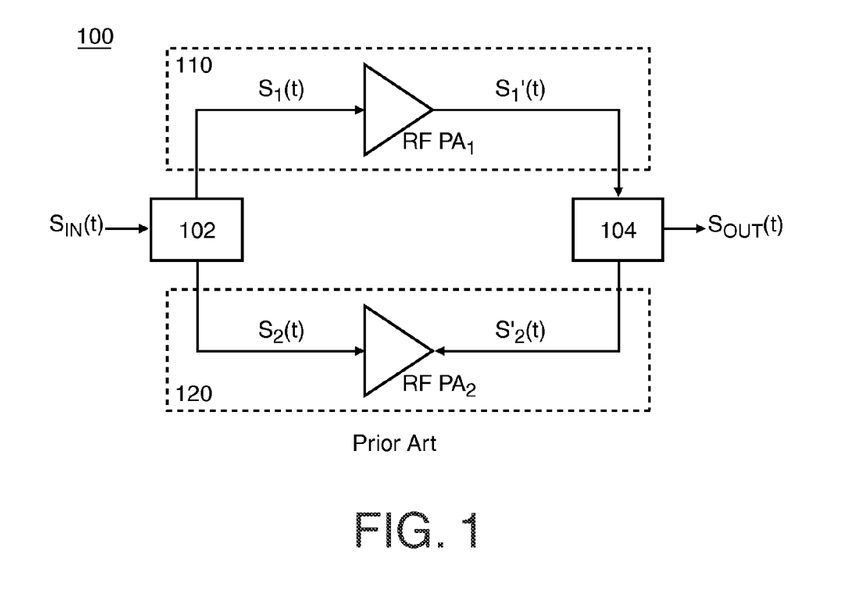
FIG. 1 is a simplified block diagram illustrating the conventional out-phasing concept.

The LINC concept, also known as out-phasing, is illustrated by means of the simplified out-phasing power amplifier (PA) 100 shown in FIG. 1. Accordingly, an amplitude (A(t)) and phase (φ(t)) modulated RF signal $S_{in}(t)$, represented by equation (1), is split by means of a signal component separation unit 102 in two RF signals $S_1(t)$, represented by equation (2), and $S_2(t)$, represented by equation (3), each being phase modulated by the baseband phase information φ(t) and an out-phasing angle θ(t) that is based on the baseband amplitude information A(t), according to equation (4). The most important aspect is the fact that both RF signals $S_1(t)$ and $S_2(t)$ have constant amplitude.

$$S_{in}(t)=A(t)\sin(\omega t+\phi(t)) \quad (1)$$

$$S_1(t)=\tfrac{1}{2}\sin(\omega t+\phi(t)+\theta(t)) \quad (2)$$

$$S_2(t)=\tfrac{1}{2}\sin(\omega t+\phi(t)-\theta(t)) \quad (3)$$

$$\theta(t)=\arccos(A(t)) \quad (4)$$

Then, the signals $S_1(t)$ and $S_2(t)$ with constant amplitudes can be separately amplified by means of efficient nonlinear saturated power amplifiers RF PA1 and RF PA2 in amplification branches 110, 120. After amplification, the output RF signal can be reconstructed by means of a signal component combiner unit 104. The output signal of the combiner unit equals the sum (or difference) of the two input signals $S_1(t)$ and $S_2(t)$ as depicted by equation (5).

$$S_{out}=S'_1(t)+S'_2(t)=G\cos(\theta(t))\sin(\omega t+\phi(t))=G\,A(t)\sin(\omega t+\phi(t)) \quad (5),$$

where G represents the gain of the amplification stages, i.e. the power amplifiers RF $PA_1$ and RF $PA_2$.

Ideally voltage sources are to be combined so that the average current in the amplification devices can vary as function of the out-phasing angle θ(t). However, if ideal class-A, class-B or class-C operation is applied, the amplification devices act as current sources and the DC current does not vary with the out-phasing angle, meaning that the efficiency drops linearly with output power, i.e. class-A like. However, in overdriven or saturated class-A, class-B or class-C operation modes, the amplification devices act more as voltage sources. That is, approximately independent of input drive and output current and the DC current is able to vary with the out-phasing angle. Ideally the efficiency will drop according to the square root of the output power, i.e. class-B like. So effectively there is no gain in power efficiency compared to a linear class-B PA design.

Power efficiency of a LINC amplifier depends strongly upon the type of power combiner used at the output. The efficiency of the combiner is reduced by the reactive part of the impedance. One combining technique that circumvents such losses is the well known Chireix combining technique as described in H. Chireix, "High power out phasing modulation", Proceedings of the Institute of Radio Engineers (Proc. IRE), vol. 23, no. 11, pp. 1370-1392, November 1935. Accordingly, the reactive part of the effective load impedance can be cancelled by the use of compensating reactances.

However, in practice it is difficult to improve the efficiency for a wide range of output power levels by implementing reactive cancellation, e.g. by using a so called RF Micro-Electromechanical System (MEMS) switches for tuning the compensating reactance as function of output power in discrete steps.

Another way to optimize the efficiency is to use switching-mode PAs, e.g. operated in class D, E, DE, or F mode, in an out-phasing configuration. In a class-DE out-phasing power amplifier with variable duty cycle the duty cycle can be used on each out-phasing path to compensate for the losses generated by the combining network, i.e. instead of the aforementioned Chireix component. However, this technique relies on accurate phase and duty cycle generation as well as control of the driving signals. Importantly, this offers very desirable capabilities for software-defined-radio (SDR) applications, where the duty cycle could be used in a digital calibration and/or pre-distortion routine during start-up of the radio for efficient and linear operation of the transmitter.

As mentioned above reduction of power consumption in transmitter circuits, in particular in the power amplifier circuitry therein, is very important. One method to realize desired reduction is use switching power amplifiers (PA) having better efficiency. However, switching PA concepts are only feasible in combination with suitable modulation methods like pulse width modulation (PWM) and out-phasing concepts, which in turn rely on accurate phase control and the duty cycle of the signals. Accordingly, one of the problems in the connection with switch-mode out-phasing PA concept is the generation of the required phase and duty cycle modulated signals with suitable accuracy.

SUMMARY OF THE INVENTION

Accordingly, it is an object of the present invention to provide a circuit architecture for generation of driving signals for out-phasing power amplifier arrangements with variable duty cycles and phase without sacrificing their accuracy.

In general, the object is achieved by an out-phasing amplifier in accordance with the invention, in which in particular switching or saturated power amplifiers are used and wherein the out-phased waveforms for driving the power amplifiers are produced in/by digital circuitry that is clocked by a phase-modulated clock signal.

Accordingly, the afore-mentioned object is achieved by a method in accordance with the appended claim 1.

Accordingly, a method for generation of out-phasing signals for a RF out-phasing power amplifier circuit arrangement for amplification of RF input signals with modulated amplitude and modulated phase, wherein the circuit comprises first and second amplification branches each having an input and an output, for amplifying one of a first and a second out-phased signal being only phase modulated and having respective duty-cycles, a combination of the out-phased signals corresponding to the RF input signal; wherein in each of the first and second amplification branches, respective first and second amplification devices are operative in a switching operation mode; wherein the method comprises generating based on the amplitude information of the RF input signal a digital control signal; phase modulating a clock signal in accordance with the phase information of the RF input signal; frequency multiplying the clock signal by a predetermined first binary factor; creating at least two copies of the phase modulated clock signal comprising a phase shift with respect to each other in accordance with the digital control signal for producing of one of the first and second out-phased signals; controlling by means of the digital control signal selective swallowing of pulses in each copy of the clock signal during a division operation compensating the frequency multiplying step thus a determined delay in the clock signal is effected corresponding to the amplitude information of the RF input signal; and multiplying the two copies of the clock signal to produce of one of the first and second out-phased signals.

In a further development of the method, the step of creating at least two phase shifted copies of the phase modulated digital signal for producing of one of the first and second out-phased signals comprises creating of four phase shifted copies of the phase modulated clock signal; the step of controlling selective swallowing of pulses in each copy of the clock signal is performed on respective two of at least two phase shifted copies of the phase modulated digital signal, and the method further comprises interpolating between respective two of the at least four phase shifted copies of the phase modulated clock signal to get a respective interpolated one of the at least two phase shifted copies of the phase modulated digital signal for producing of one of the first and second out-phased signals; and multiplying at least two interpolated phase shifted copies of the phase modulated digital signal to produce one of the first and second out-phased signal.

The afore-mentioned object is further achieved by a RF power amplifier circuit arrangement for amplification of RF input signals with modulated amplitude and modulated phase in accordance with the appended claim 3.

Accordingly, the RF power amplifier circuit arrangement comprises first and second amplification branches each having an input and an output, for amplifying one of a first and a second out-phased signal being only phase modulated and having respective duty-cycles, a combination of the out-phased signals corresponding to the RF input signal; wherein in each of the first and second amplification branches, respective first and second amplification devices are operative in a switching operation mode; wherein a combination circuit is configured to combine the outputs of the first and second amplification branches such that the circuit arrangement is operative as an out-phasing amplifier arrangement. The circuit further comprises a phase modulating unit configured to provide a digital clock signal, which is phase modulated in accordance with the phase information of the RF input signal, and to up-convert the basic frequency of the clock signal by a predetermined binary factor. An out-phasing signals generation unit receiving the up-converted clock signal and a digital control signal and configured to create at least two copies of the phase modulated clock signal with a selected phase shift in accordance with the digital control signal as basic signals for a respective one of the first and second out-phasing signal, to selectively swallow pulses in each copy of the clock signal in accordance with the digital control signal during a division operation for down-converting the frequency by the predetermined binary factor so that a determined delay in each copy of the clock signal is effected, and to multiply the two copies of the clock signal to produce of one of the first and second out-phased signals.

Certain embodiments of the RF power amplifier circuit further comprises an signal component separation unit arranged for generating the digital control signal based on the amplitude information of the RF input signal and to provide a phase information of the RF input signal to the phase modulating unit.

In a further development of the circuit arrangement, the out-phasing signals generation unit is further configured to create four phase shifted copies of the phase modulated clock signal, and to swallow selectively pulses in each copy of the clock signal in accordance with the digital control signal during the division operation for down-converting the frequency by the predetermined binary factor and synchronously in a respective first and second set comprising respective two of the four phase shifted copies of the phase modulated digital signal. The out-phasing signals generation unit may further comprise a first and second interpolating unit receiving respectively the down-converted first and second set of the phase modulated clock signals, wherein each interpolating unit is configured to output one respective interpolated clock signal for production of one of the first and second out-phased signals. Finally, the out-phasing signals generation unit is configured to combine respective two interpolated clock signals to produce one of the first and second out-phased signal.

In certain embodiments of the circuit arrangement the out-phasing signals generation unit further comprises an logic operation unit for implementing the combination of respective two interpolated clock signals to produce one of the first and second out-phased signal by means a binary multiplication.

In particular embodiments the out-phasing signals generation unit comprises a first binary circuit element, in particular a Flip-Flop element, which is configured to receive the digital control signal and the digital clock signal, which is phase modulated in accordance with the phase information of the RF input signal, from the phase modulating unit, and which is further configured to provide the copies of the digital clock signal with a selectable phase shift in accordance with the digital control signal.

In more detail, the out-phasing signals generation unit may comprise a respective signal path for processing of each copy of the clock signal in form of digital circuitry, which can advantageously be comprised or set up from cascaded binary circuit elements, in particular Flip-Flop elements, configured and connected for implementing the swallowing of pulses and the division operation for down-converting the frequency by the predetermined binary factor.

The first and second amplification devices may comprise a circuit configuration operative as switching-mode power amplifiers in one of class-D, class-DE, class-E, class-F, or class-E/F mode.

The circuit arrangement according to the invention is particular suitable for a system in which wide-band complex envelope signals are processed. In particular in transmitters for connectivity and cellular applications, where the modulation standards with high PAR require the power amplifier to be efficient over a large dynamic range to save on the battery life time. Examples for such systems may be Enhanced Data rates for GSM (Global System for Mobile communications) Evolution (EDGE), Universal Mobile Telecommunications System (UMTS) using Wideband Code Division Multiple Access (W-CDMA) modulation, High-Speed Packet Access in the Uplink or Downlink (HsxPA), Worldwide Interoperability for Microwave Access (WiMAX) using Orthogonal Frequency-Division Multiple Access (OFDM) modulation, and third generation Long Term Evolution (3G-LTE) using OFDM modulation or alike. It goes without saying that the afore-mentioned standards are only named as illustrative examples and thus, it is not intended to limit the in present invention thereon.

It goes without saying that those skilled in the art recognize that the discussed aspects of the invention may be combined as applicable.

Preferred embodiments and further developments of the invention are defined in the dependent claims of the independent claims. It shall be understood that the circuit arrangement of the invention and the method have similar and/or identical preferred embodiments as defined in the dependent claims thereof.

BRIEF DESCRIPTION OF THE DRAWINGS

These and other aspects of the invention will be apparent from and elucidated with reference to the embodiment(s) described hereinafter. In the following drawings the Figures are schematically drawn and not true to scale, and identical reference numerals in different Figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION OF EMBODIMENTS

Figure 2:
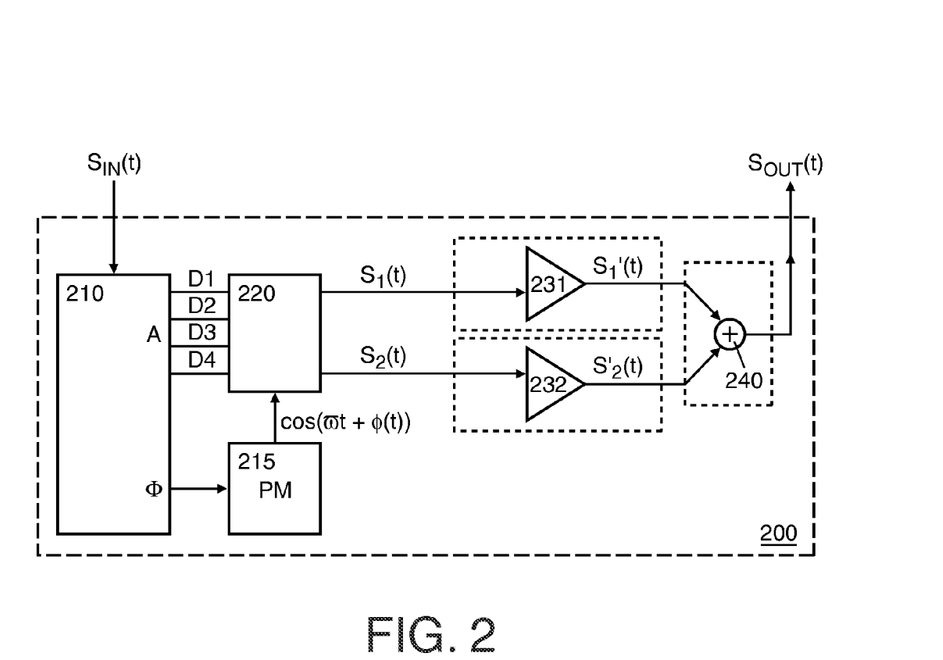
FIG. 2 shows a simplified block diagram of a transmitter architecture with an out-phasing angle and duty cycle generation unit.

According to the basic concept of the invention, as illustrated in FIG. 2, in an out-phasing power amplifier arrangement 200, a signal component separation unit 210 receives the input signal $S_{in}(t)$ ($=A(t)\sin(\omega t+\phi(t))$) to be amplified. Based on the input signal $S_{in}(t)$, the signal component separation unit 210 is arranged and configured to generate a basic phase modulated signal carrying the phase information of the input signal as basis for generation of two out-phasing signals for driving power amplifier arrangement in an out-phasing configuration.

Further, the signal component separation unit 210 is configured and arranged to control generation of the out-phasing angle $\theta(t)$ and the duty cycles $d_1$ and $d_2$ of the two out-phasing signals $S_1(t)$ and $S_2(t)$ by providing a digital control signal based on the baseband amplitude information $A(t)$ of the input signal, which digital control in certain embodiments comprises a set of n-bit digital control words D1, D2, D3 and D4, to an out-phasing signals generation unit 220, in which the phase and the duty cycle of the out-phasing signals is set.

Furthermore, the signal component separation unit 210 is configured and arranged to supplying the baseband phase information $\phi(t)$ of the input signal to a phase modulation (PM) unit 215, which provides a corresponding phase modulated clock signal as the basic phase modulated signal to the out-phasing signals generation unit 220.

The out-phasing signals $S_1(t)$ and $S_2(t)$, generated in or by the out-phasing signals generation unit 220, are used for driving respective switched power amplifying devices 231, 232. The respective amplified output signals $S'_1(t)$ and $S'_2(t)$ of the two power amplifying devices 231, 232 are finally combined by means of a suitable combining unit 240, which provides at its output the desired amplified input signal $S_{out}$ (=$GA(t)\sin(\omega t+\phi(t))$).

According to one aspect of the present invention, the phase information $\phi(t)$ of the input (baseband) signal $S_{in}(t)=A(t)\sin(\omega t+\phi(t))$ to be amplified is phase modulated back by the PM unit 215 into radio frequency (RF) clock signal. The phase modulated RF signal $\cos(\omega t+\phi(t))$, carrying the phase information of the input signal, is supplied as a clock signal to the out-phasing signals generation (OSG) unit 220. The phase modulated clock signal is up-converted by predetermined factor, e.g. by frequency multiplying with a binary factor $2^{n-1}$.

According to a second aspect of the present invention, the out-phasing angle of the generated out-phasing signals $S_1(t)$ and $S_2(t)$ is coupled to the amplitude information of the input (baseband) signal $S_{in}(t)$. As will be understood in connection with the description of FIGS. 3 and 7, the resolution of the out-phasing angle $\theta(t)$ coupled to the amplitude resolution is $2\pi/2^n$, equivalently, and the resolution of the duty cycle is $2\pi/2^{n-1}$, equivalently. It is worth to be noted that the resolution of the phase information $\phi(t)$ is also dependent on the realization of the phase modulation (PM) performed in the PM unit 215. Consequently, as higher the number n of bits as better the resolution. For example, in order to achieve a resolution of 6.25% in the duty cycle, a number of five bits, i.e. n=5, is appropriate (cf. $\frac{1}{2}^{n-1}=\frac{1}{2}^{5-1}=0.0625=6.25\%$).

In the following a first embodiment is described in detail in order to explain the principle for building and applying the fully digital out-phasing signals generation (OSG) unit of the invention.

Merely for the purpose of simplification, a 4 times 4-bit implementation of the digital control signal is used by way of example without intending to limit the invention thereto. Basically, the digital control signal is implemented by four digital control words, where each digital word D1, D2, D3, D4 is a word comprised of 4 bits, i.e. a 4-bit word.

D1=b0 b1 b4 b5;
D2=b2 b3 b6 b7;
D3=b0' b1' b4' b5'; and
D4=b2' b3' b6' b7'

Figure 3:
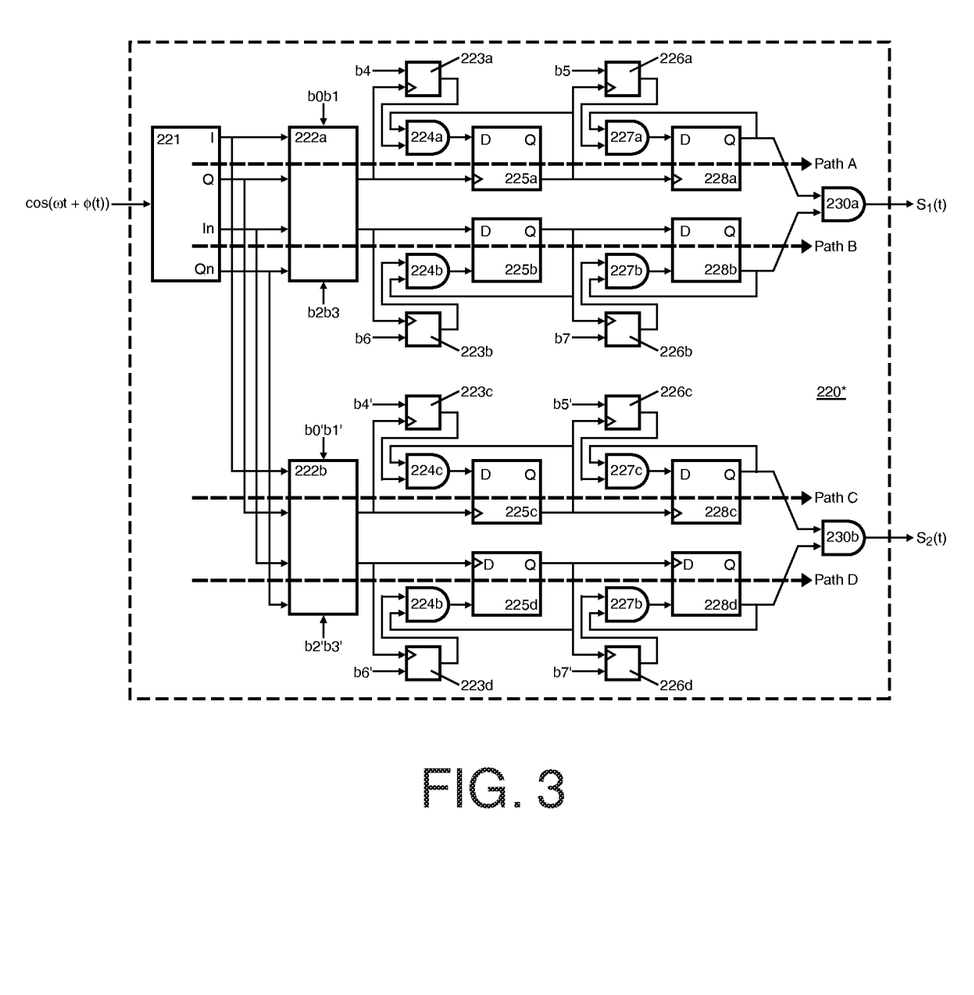
FIG. 3 shows a block diagram of the out-phasing angle and duty cycle generation unit for generation of the out-phased signals $S_1(t)$ and $S_2(t)$ with variable duty cycles.

Now with reference to FIG. 3 showing one possible 4×4-bit implementation of an OSG unit 220* implementing the OSG unit 220 of FIG. 2. Basically, the OSG unit 220* comprises four internal signal paths designated with A, B, C, and D, respectively, each of which paths, in general, comprises respective two cascaded D-Flip-Flops (D-FF) as digital circuitry elements, which D-FFs implement in each path a controllable division unit with a total division factor by 4, i.e. a division-by-4-unit. Further, a first D-FF 221 is common part of all paths A, B, C, and D and divides the input clock signal $\cos(\omega t+\phi(t))$ carrying the phase information of the input signal by 2. Thus, the effective division factor realized in each path is 8. Therefore, as basis for generation of the out-phased signals the clock signal provided by the PM unit 215 is frequency multiplied by a binary factor $2^{n-1}$, i.e. the clock signal is up converted by $2^{n-1}=2^{4-1}=8$. In other words, the output signal of the OSG unit 220* has finally again the frequency $\omega$ of the phase modulated clock signal before being up-converted by $2^{n-1}$.

The first D-FF 221 provides as output four phase shifted copies or phases, respectively, of the phase modulated input clock signal, of which respective two are shifted by 90° or $\pi/2$, equivalently, with respect to each other, namely I (phase shift: 0°), Q (phase shift: 90°), In (phase shift: 180°), Qn (phase shift: −90°). In other words, in path A, bits b0 and b1 (i.e. in path B: bits b2 and b3, in path C: bits b0' and b1', and in path D: bits b2' and b3') controlling the high frequency or RF input clock signal in path A are effectively responsible for the fine phase resolution with steps of $\pi/8$, equivalently.

Respective two from the four phase shifted copies I, Q, In, Qn are selected as input signal for path A and B, respectively, wherein the selection is implemented by means of a first multiplexer (MUX) unit 222a, which is controlled by the first 4-bit word D1, i.e. by the bits b0, b1, b2, b3. Two respective bits of the first 4-bit word D1 are used to select one of the four digital signals I, Q, In, Qn as input for one path A or B, respectively.

In the same way, for the paths C and D, two from the four digital signals I, Q, In, Qn are selected as input by means of a second MUX 222b controlled by the third 4-bit word D3, i.e. bits b0', b1', b2', b3'.

Then, in each path A, B, C, and D the respective output signal of the respective MUX 222a, 222b is respectively further divided by 4 by means of two respective cascaded D-FFs 225a and 228a, 225b and 228b, 225c and 228c, and 225d and 228d, respectively, in order to generate a respective output signal in each path A, B, C, and D with desired frequency $\omega$ and phase $\phi(t)$.

By way of example, the signal processing, in particular generation of the correct out-phase and duty cycle, in path A is now described in more detail. It will be appreciated that the description can correspondingly be applied to the other paths B, C, and D, respectively.

Further, for the correct out-phasing angel $\theta(t)$, in path A, the first one of two D-FFs 225a, 228a is controlled by bit b4 (in path B by bit b6, in path C by b4', and in path D by b6'). Thus, if the bit b4 of the second 4-bit word D1 is logical zero, i.e. low, then the input data of the D-FF 225a during one input signal cycle (which is selected as explained before by bits b0, b1) are swallowed. This swallow operation is implemented by use of AND gate 224a. Accordingly, if bit b4 of the second 4-bit word D1 is logical 1, i.e. high, no swallow operation takes place, i.e. the output of D-FF 223a follows the input data, i.e. input clock signal, from the very start. Hence, the bit b4 (b6, b4', or b6', respectively, in the other paths B, C, and D, respectively) is controlling a 90° or $\pi/2$, equivalently, shift or delay in the phase of the signal in path A.

In a similar manner, the last D-FF 228a, in path A (i.e. in path B: 228b, in path C: 228d, and in path D: 228d), is controlled by bit b5 of the second 4-bit word D2 (i.e. bit b7 of word D2, bit b5' of word D3, or bit b7' of word D4, respectively, in the other paths B, C, and D, respectively). Hence, bit b5 is controlling a phase shift or delay by 180° or $\pi$, equivalently, of the signal in path A.

As a result, the 4-bits b0, b1, b4, and b5 of the first 4-bit word D1 allow to generate, in path A signals that are out-phased compared to their original phase with the resolution of $2\pi/2^n$, which is, in this example, $\pi/8$ (or 22.5°, equivalently) for n=4.

Assumed that all signal in paths A, B, C, and D have a duty cycle of 50%, by selecting the applicable digits in the respective 4-bit words D1, D2 and D3, D4, respectively, on two paths A and B, or C and D, respectively, the output signals of the respective both paths can be combined, e.g. by means of a multiplication operation implemented in FIG. 3 by an AND gate 230a or 230b, respectively, in order to generate one of the desired out-phasing signals $S_1(t)$ and $S_2(t)$, respectively, with any desired duty cycle d and out-phasing angle θ(t) while still maintaining the correct phase information φ(t).

For sake of better understanding of how the digital circuitry based phase and duty cycle generation (OSG) unit 120 works, an example is provided in the following with the assumption of following conditions of the control signal, i.e. the digital control words D1, D2, D3, and D4.

D1=b0 b1 b4 b5=1 0 1 1
D2=b2 b3 b6 b7=1 0 0 0
D3=b0' b1' b4' b5'=0 0 1 1
D4=b2' b3' b6' b7'=0 0 0 0

Figures 4A, 4B:
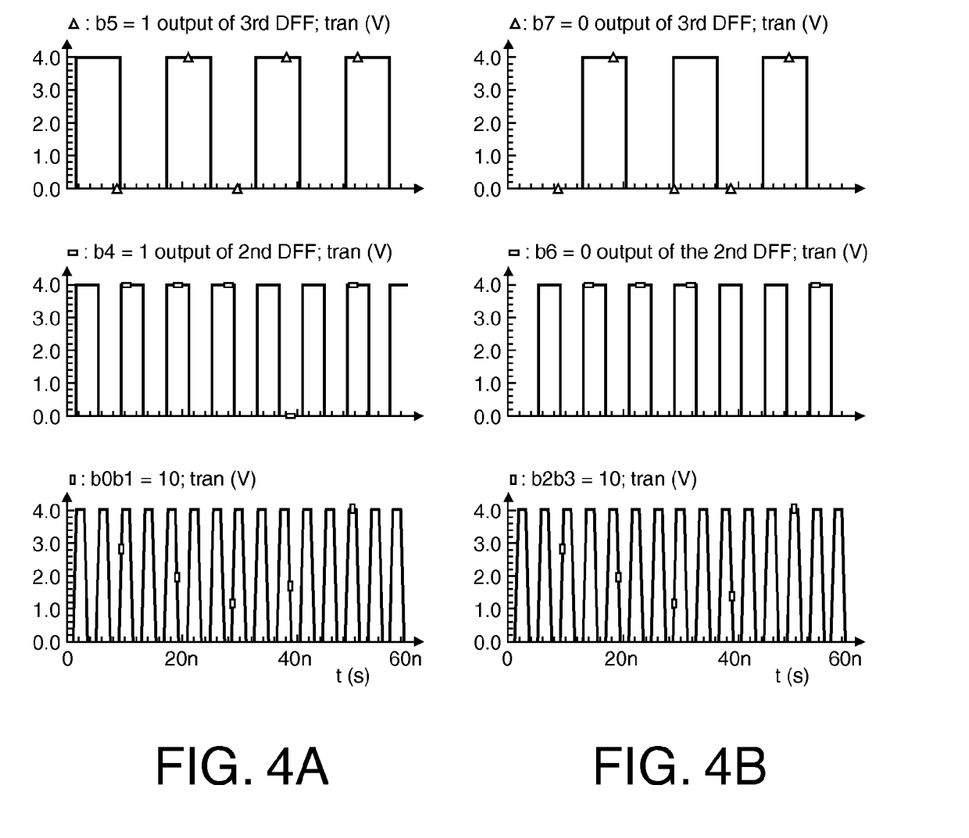
FIGS. 4a, 4b depict the transient responses at the output of the 1st, 2nd, and 3rd D-FF of FIG. 3 on path A and path B, respectively.

Now with reference to FIGS. 4a and 4b, the out-phasing signals which are out-phased by angles $\theta_1(t)$ and $\theta_2(t)$, respectively, generated on path A and B, respectively, are illustrated. When the duty cycle of the clock signals is 50% at the output of the last D-FF 228a and 228b, respectively, a signal of +θ(t) and a duty cycle d is generated by multiplying the two clock signals on path A and B by means of the AND gate 230a in FIG. 3.

Figure 5A:
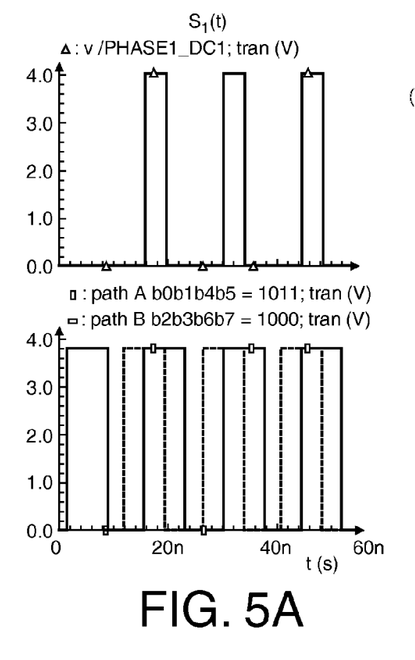
FIGS. 5a, 5b illustrate on the left hand side out-phased signal $S_1(t)$ with duty cycle $d_1$ and an the right hand side out-phased signal $S_2(t)$ with duty cycle $d_2$.
Figure 5B:
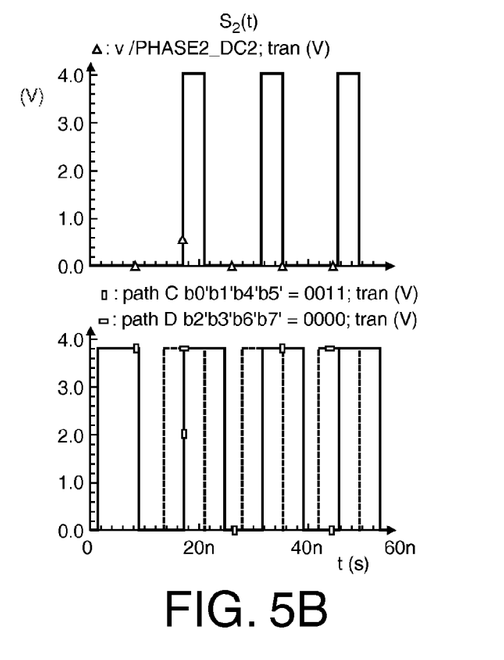
Figure 6:
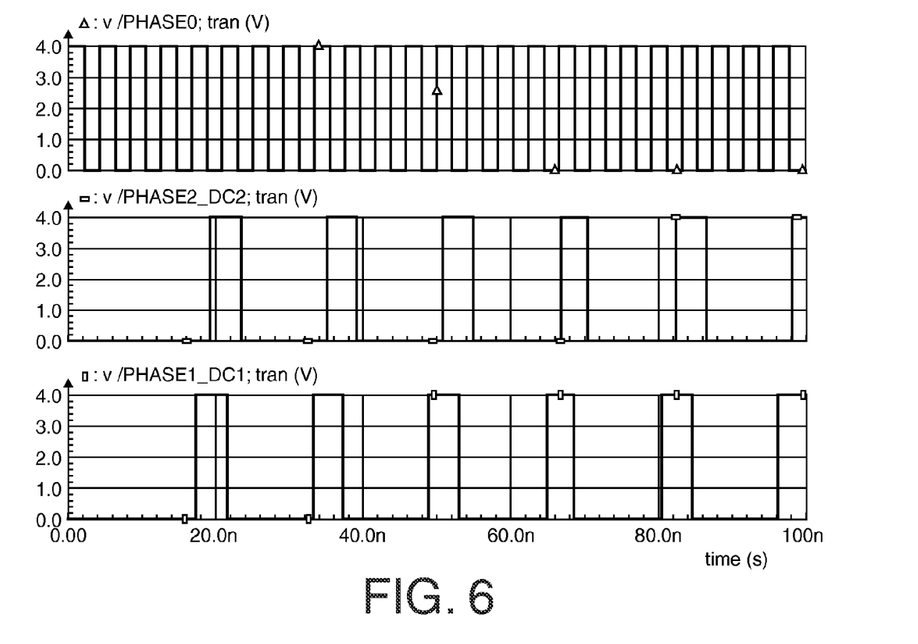
FIG. 6 shows the out-phased signals $S_1(t)$ with duty cycle $d_1$ and $S_2(t)$ with duty cycle $d_2$ with an out-phasing angle of $\theta(t)=\pi/8$.

FIG. 5a depicts the resulting out-phasing signal $S_1(t)=\cos(\omega t+\phi+\theta)$ with duty cycle $d_1$ as well as the respective two clock signals in path A and B. In similar manner, two out-phased signals are provided at the output of paths C and D and their multiplication by AND gate 229b results in the out-phasing signal $S_2(t)=\cos(\omega t+\phi-\theta)$ with duty cycle $d_2$, shown in FIG. 5b.

Figure 8:
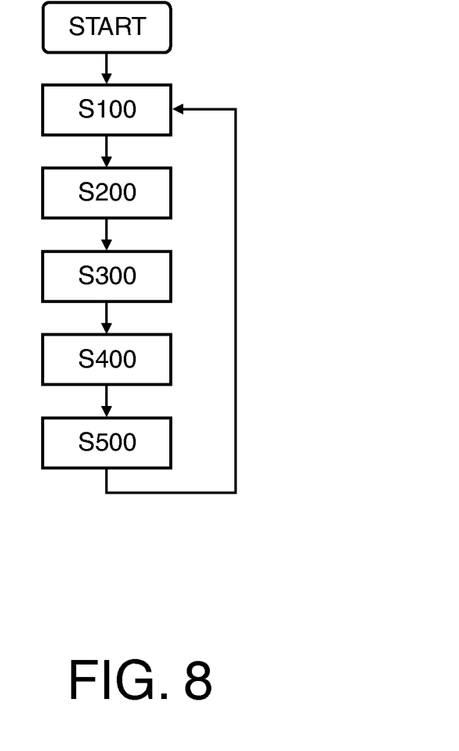
FIG. 8 illustrates the method of generation of out-phasing signals according to the basic concept of the invention by way of a flow chart.

Summarizing, the generation of the accurate out-phasing signals can be illustrated by as method illustrated by the flow chart in FIG. 8 comprising the steps of: in step S100 based on the amplitude information (A(t)) of the RF input signal at least one digital control signal, which may comprise of the digital control words D1, D2, D3, and D4, is generated. Then in step S200 a clock signal is phase modulated in accordance with the phase information (φ(t)) of the RF input signal, which clock signal is used as basis signal for generation of the two wanted out-phasing signals. Next, in step S300, at least two copies of the phase modulated clock signal, which comprising a selected phase shift with respect to each other are created in accordance with the digital control signal for producing of one of the first and second out-phased signals. Then in step S400 selective swallowing of pulses in the clock signal is controlled in a binary division of each copy of the clock signal by means of the digital control signal (D1, D2, D3, D4) in order to effect a determined delay corresponding to the amplitude information (A(t)) of the RF input signal. Finally, in step S500 the two copies of the clock signal are combined, e.g. by means of a digital multiplication such as a digital AND operation, in order to produce of one of the first and second out-phased signals. Steps S300 up to S500 are also performed to generate the second out-phasing signal. It goes without saying that the method is an ongoing process, as the phase and amplitude information contained in the input signal to be amplified changes so the phase and the out-phasing angle in the out-phasing signals have to follow.

As it regards the amplitude information A(t) for the generation of the control words or codes (D1, D2, D3 and D4), the digital representation of A(t), which in certain cases is already available in baseband can be used, i.e. in cases where the amplitude information A(t) is no analog signal. In other embodiments an algorithm in the signal component separation unit 210 (FIG. 2) may be used that extracts the required control words D1, D2, D3 and D4 from the N-bit baseband representation of the amplitude information. In other words, it is a matter of defining a certain relation.

In the following a table is provided showing all the relations between the digits and out-phasing angle θ(t) duty cycle d, as used to demonstrate the basic idea of the present invention. The table may be used as a look up table (LUT).

| D1 | D2 | θ(t) | d |
|------|------|--------|------|
| 0110 | 1111 | 0 | 1/16 |
| 1010 | 1111 | 0 | 2/16 |
| 0010 | 1111 | 0 | 3/16 |
| 1100 | 1111 | 0 | 4/16 |
| 0100 | 1111 | 0 | 5/16 |
| 1000 | 1111 | 0 | 6/16 |
| 0000 | 1111 | 0 | 7/16 |
| 1111 | 1111 | 0 | 8/16 |
| 1010 | 0111 | π/8 | 1/16 |
| 0010 | 0111 | π/8 | 2/16 |
| 1100 | 0111 | π/8 | 3/16 |
| 0100 | 0111 | π/8 | 4/16 |
| 1000 | 0111 | π/8 | 5/16 |
| 0000 | 0111 | π/8 | 6/16 |
| 1111 | 0111 | π/8 | 7/16 |
| 0111 | 0111 | π/8 | 8/16 |
| 0010 | 1011 | 2π/8 | 1/16 |
| 1100 | 1011 | 2π/8 | 2/16 |
| 0100 | 1011 | 2π/8 | 3/16 |
| 1000 | 1011 | 2π/8 | 4/16 |
| 0000 | 1011 | 2π/8 | 5/16 |
| 1111 | 1011 | 2π/8 | 6/16 |
| 0111 | 1011 | 2π/8 | 7/16 |
| 1011 | 1011 | 2π/8 | 8/16 |
| 1100 | 0011 | 3π/8 | 1/16 |
| 0100 | 0011 | 3π/8 | 2/16 |
| 1000 | 0011 | 3π/8 | 3/16 |
| 0000 | 0011 | 3π/8 | 4/16 |
| 1111 | 0011 | 3π/8 | 5/16 |
| 0111 | 0011 | 3π/8 | 6/16 |
| 1011 | 0011 | 3π/8 | 7/16 |
| 0011 | 0011 | 3π/8 | 8/16 |
| 0100 | 1101 | 4π/8 | 1/16 |
| 1000 | 1101 | 4π/8 | 2/16 |
| 0000 | 1101 | 4π/8 | 3/16 |
| 1111 | 1101 | 4π/8 | 4/16 |
| 0111 | 1101 | 4π/8 | 5/16 |
| 1011 | 1101 | 4π/8 | 6/16 |
| 0011 | 1101 | 4π/8 | 7/16 |
| 1101 | 1101 | 4π/8 | 8/16 |
| 1000 | 0101 | 5π/8 | 1/16 |
| 0000 | 0101 | 5π/8 | 2/16 |
| 1111 | 0101 | 5π/8 | 3/16 |
| 0111 | 0101 | 5π/8 | 4/16 |
| 1011 | 0101 | 5π/8 | 5/16 |
| 0011 | 0101 | 5π/8 | 6/16 |
| 1101 | 0101 | 5π/8 | 7/16 |
| 0101 | 0101 | 5π/8 | 8/16 |
| 0000 | 1001 | 6π/8 | 1/16 |
| 1111 | 1001 | 6π/8 | 2/16 |
| 0111 | 1001 | 6π/8 | 3/16 |
| 1011 | 1001 | 6π/8 | 4/16 |
| 0011 | 1001 | 6π/8 | 5/16 |
| 1101 | 1001 | 6π/8 | 6/16 |
| 0101 | 1001 | 6π/8 | 7/16 |
| 1001 | 1001 | 6π/8 | 8/16 |
| 1111 | 0001 | 7π/8 | 1/16 |
| 0111 | 0001 | 7π/8 | 2/16 |
| 1011 | 0001 | 7π/8 | 3/16 |
| 0011 | 0001 | 7π/8 | 4/16 |
| 1101 | 0001 | 7π/8 | 5/16 |
| 0101 | 0001 | 7π/8 | 6/16 |
| 1001 | 0001 | 7π/8 | 7/16 |
| 0001 | 0001 | 7π/8 | 8/16 |
| 0111 | 1110 | −π | 1/16 |
| 1011 | 1110 | −π | 2/16 |
| 0011 | 1110 | −π | 3/16 |
| 1101 | 1110 | −π | 4/16 |
| 0101 | 1110 | −π | 5/16 |

-continued

| D1 | D2 | θ(t) | d |
|---|---|---|---|
| 1001 | 1110 | −π | 6/16 |
| 0001 | 1110 | −π | 7/16 |
| 1110 | 1110 | −π | 8/16 |
| 1011 | 0110 | −π/8 | 1/16 |
| 0011 | 0110 | −π/8 | 2/16 |
| 1101 | 0110 | −π/8 | 3/16 |
| 0101 | 0110 | −π/8 | 4/16 |
| 1001 | 0110 | −π/8 | 5/16 |
| 0001 | 0110 | −π/8 | 6/16 |
| 1110 | 0110 | −π/8 | 7/16 |
| 0110 | 0110 | −π/8 | 8/16 |
| 0011 | 1010 | −2π/8 | 1/16 |
| 1101 | 1010 | −2π/8 | 2/16 |
| 0101 | 1010 | −2π/8 | 3/16 |
| 1001 | 1010 | −2π/8 | 4/16 |
| 0001 | 1010 | −2π/8 | 5/16 |
| 1110 | 1010 | −2π/8 | 6/16 |
| 0110 | 1010 | −2π/8 | 7/16 |
| 1010 | 1010 | −2π/8 | 8/16 |
| 1101 | 0010 | −3π/8 | 1/16 |
| 0101 | 0010 | −3π/8 | 2/16 |
| 1001 | 0010 | −3π/8 | 3/16 |
| 0001 | 0010 | −3π/8 | 4/16 |
| 1110 | 0010 | −3π/8 | 5/16 |
| 0110 | 0010 | −3π/8 | 6/16 |
| 1010 | 0010 | −3π/8 | 7/16 |
| 0010 | 0010 | −3π/8 | 8/16 |
| 0101 | 1100 | −4π/8 | 1/16 |
| 1001 | 1100 | −4π/8 | 2/16 |
| 0001 | 1100 | −4π/8 | 3/16 |
| 1110 | 1100 | −4π/8 | 4/16 |
| 0110 | 1100 | −4π/8 | 5/16 |
| 1010 | 1100 | −4π/8 | 6/16 |
| 0010 | 1100 | −4π/8 | 7/16 |
| 1100 | 1100 | −4π/8 | 8/16 |
| 1001 | 0100 | −5π/8 | 1/16 |
| 0001 | 0100 | −5π/8 | 2/16 |
| 1110 | 0100 | −5π/8 | 3/16 |
| 0110 | 0100 | −5π/8 | 4/16 |
| 1010 | 0100 | −5π/8 | 5/16 |
| 0010 | 0100 | −5π/8 | 6/16 |
| 1100 | 0100 | −5π/8 | 7/16 |
| 0100 | 0100 | −5π/8 | 8/16 |
| 0001 | 1000 | −6π/8 | 1/16 |
| 1110 | 1000 | −6π/8 | 2/16 |
| 0110 | 1000 | −6π/8 | 3/16 |
| 1010 | 1000 | −6π/8 | 4/16 |
| 0010 | 1000 | −6π/8 | 5/16 |
| 1100 | 1000 | −6π/8 | 6/16 |
| 0100 | 1000 | −6π/8 | 7/16 |
| 1000 | 1000 | −6π/8 | 8/16 |
| 1110 | 0000 | −7π/8 | 1/16 |
| 0110 | 0000 | −7π/8 | 2/16 |
| 1010 | 0000 | −7π/8 | 3/16 |
| 0010 | 0000 | −7π/8 | 4/16 |
| 1100 | 0000 | −7π/8 | 5/16 |
| 0100 | 0000 | −7π/8 | 6/16 |
| 1000 | 0000 | −7π/8 | 7/16 |
| 0000 | 0000 | −7π/8 | 8/16 |

In order to illustrate the performance of the here proposed architecture in numbers, it is assumed, by way of example, that the carrier frequency of the input (baseband) signal is $f_0=2.4$ GHz. Accordingly, for the 4×4-bit implementation the input clock driving the first D-FF 221 of FIG. 3 should be up-converted or frequency multiplied to $f=2^{4-1} \cdot f_0=19.2$ GHz; CMOS frequency dividers operating at frequencies above 40 GHz already exist, e.g. as described in R. Mohanavelu, P. Heydari, "*A novel 40-GHz flip-flop-based frequency divider in 0.18 um CMOS*", Proceedings of ESSCIRC, Grenoble, France 2005.

The resolution of the afore-mentioned implementation can be improved, for instance, to π/16 by increasing the clock frequency of the input signal to 38.4 GHz, e.g. by introduction of an extra D-FF as well as an extra control bit. In terms of time steps the resolution in out-phasing angle reaches the value of 13 ps accuracy and in duty cycle the value of 26 ps.

According to a further development of the present invention, in case the resolution, in the example, of the out-phasing angle θ(t) should be not sufficient, e.g. for communications standards with high dynamic range (DR) requirements, instead of only increasing the number n of bits additionally or alternatively interpolation techniques can be used to virtually increase the resolution on the out-phasing angle, while the same duty cycle can be maintained.

According to a further development, interpolation techniques are applied, additionally. That is to say, by means of some extra bits and of some extra D-FFs, the resolution on the out-phasing angle may be increased as required.

Figure 7:
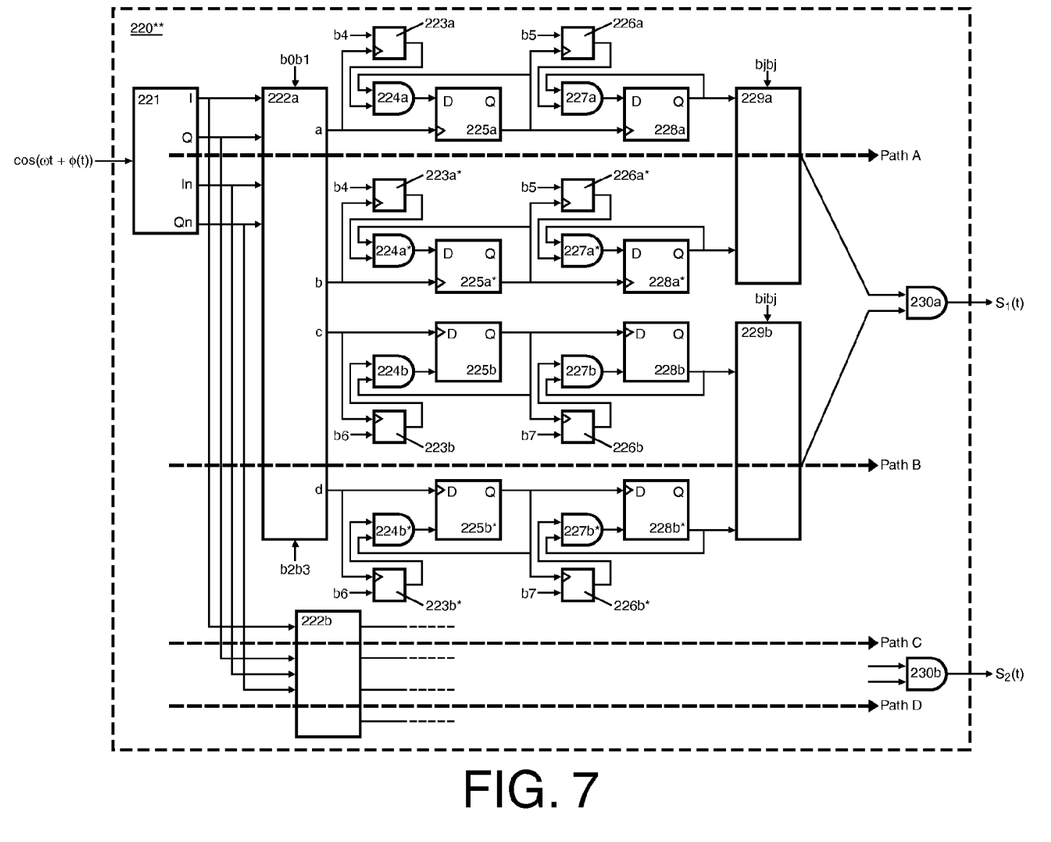
FIG. 7 depicts the block diagram of the herein proposed architecture for generation of out-phased signals $S_1(t)$ and $S_2(t)$ with variable duty cycles, wherein digital phase interpolators are used to increase further the resolution.

In the following, in connection with FIG. 7, a further development, in which interpolation is applied, is described. It is noted that only signal paths A and B are illustrated in detail and only path A is discussed in more detail, since the signal processing in the paths B, C and D is built up in a corresponding way which is apparent to the person skilled in the art.

Each multiplexer (MUX) unit 222a, 222b outputs four signals a, b, c, and d of which signal a leads signal b by π/2, and signal c leads signal d by π/2. For example, if the bits b0, b1 of word D1 are both logical zero, i.e. "b0 b1"="0 0", then signal a is Qn and signal b is I. Then signals a and b are further divided by 4 by means of the cascaded D-FF 225a, 128a and 225a\*, 228a\*, respectively, wherein the phases of signals a and b are selected by the same set of bits b4, b5 of word D1, as shown in FIG. 7.

As a result, the two input signals of a first interpolator unit 229a are π/8 out of phase. The first digital interpolator unit 229a is arranged and configured to interpolate between its two input signals and thus to increase the resolution at the output of the interpolator unit virtually by $\frac{1}{2}^m$ times, where m is the number of bits used in the respective interpolator unit 129a or 129b, respectively.

It will be appreciated that one major advantage inter alia of the present invention is the fact that the OSG unit 220, 220\*, **220\*\*** can be implemented in full digital hardware, i.e. by a block set up from digital circuitry elements. Thus, in certain herein discussed embodiments the generation of the out-phasing signals $S_1(t)$ and $S_2(t)$ with variable duty cycle is implemented as a digital circuit block based on application of D-flip-flop (D-FF) as digital circuitry elements. In this connection it is worth to be noted that this way a complete digitization of a transmitter (Tx) up to the power amplifiers (PAs) is possible as well as advantageous since it provides for high accuracy with high flexibility in architecture.

Figure 9:
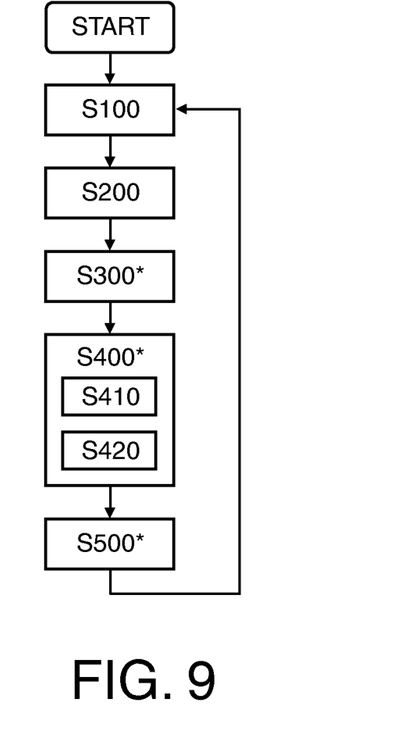
FIG. 9 illustrates the method of generation of out-phasing signals according to the invention according to the further development by way of a flow chart.

Summarizing, FIG. 9 illustrates the generation of the accurate out-phasing signals in accordance with the further development of the invention by means a flow chart, modified with respect to FIG. 8. Accordingly, the step S300 of FIG. 8 is modified to a step S300\* in which four phase shifted copies of the phase modulated clock signal are created. Then, in step S400\* selective swallowing of pulses in the clock signal is controlled in a binary division of each copy of the clock signal by means of the digital control signal (D1, D2, D3, D4) in order to effect a determined delay corresponding to the amplitude information (A(t)) of the RF input signal, wherein the step S400\* is modified vis-à-vis step S400 of FIG. 8 in that the step is performed on respective two of at least two phase shifted copies of the phase modulated digital signal. Next, the in accordance with the further development, the method further comprises a step S410, in which between respective two of the at least four phase shifted copies of the phase modulated clock signal a digital interpolation operation is performed in order to get in step S420 a respective interpolated one of the at least two phase shifted copies of the phase modulated digital signal for producing of one of the first and second out-phased signals. Finally, in step S500* at least two interpolated phase shifted copies of the phase modulated digital signal are combined by e.g. a digital multiplication operation in order to produce one of the first and second out-phased signal. Again, steps S300* up to S500* are also performed to generate the second out-phasing signal. Further, the method is still an ongoing process, as the phase and amplitude information contained in the input signal to be amplified changes so the phase and the out-phasing angle in the out-phasing signals have to follow.

The herein introduced architecture for a out-phasing power amplifier is particularly applicable for power amplifiers in mobile and/or wireless communication terminals as well as base-stations used in cellular systems like GSM, EDGE and UMTS and/or wireless connectivity systems like WiMAX.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. Method for driving a RF out-phasing power amplifier circuit arrangement for amplification of RF input signals with modulated amplitude and modulated phase, wherein the circuit includes first and second amplification branches each having an input and an output, for amplifying one of a first and a second out-phased signal, being only phase modulated and having respective duty-cycles, a combination of the out-phased signals corresponding to the RF input signal; wherein in each of the first and second amplification branches, respective first and second amplification devices are operative in a switching operation mode; wherein the method comprises:

generating based on the amplitude information of the RF input signal a digital control signal;

phase modulating a clock signal in accordance with the phase information of the RF input signal;

frequency multiplying the clock signal by a predetermined binary factor;

creating at least two copies of the phase modulated clock signal including a phase shift with respect to each other in accordance with the digital control signal for producing of one of the first and second out-phased signals;

controlling by means of the digital control signal selective swallowing of pulses in each copy of the clock signal during a division operation compensating the frequency multiplying step thus a determined delay in the clock signal is effected corresponding to the amplitude information of the RF input signal; and multiplying the two copies of the clock signal to produce of one of the first and second out-phased signals.

2. Method according to claim 1, wherein the step of creating at least two phase shifted copies of the phase modulated digital signal for producing of one of the first and second out-phased signals comprises creating of four phase shifted copies of the phase modulated clock signal; and wherein the step of controlling selective swallowing of pulses in each copy of the clock signal is performed on respective two of at least two phase shifted copies of the phase modulated digital signal, and wherein the method further comprises:

interpolating between the respective two of the at least four phase shifted copies of the phase modulated clock signal to get a respective interpolated one of the at least two phase shifted copies of the phase modulated digital signal for producing of one of the first and second out-phased signals; and multiplying at least two interpolated phase shifted copies of the phase modulated digital signal to produce one of the first and second out-phased signal with out-phased pulses having a predetermined duty cycle carrying the amplitude information of the RF input signal.

3. RF power amplifier circuit arrangement for amplification of RF input signals with modulated amplitude and modulated phase, wherein the circuit arrangement comprises:

first and second amplification branches each having an input and an output, for amplifying one of a first and a second out-phased signal being only phase modulated and having respective duty-cycles, a combination of the out-phased signals corresponding to the RF input signal; wherein in each of the first and second amplification branches, respective first and second amplification devices are operative in a switching operation mode; wherein a combination circuit is configured to combine the outputs of the first and second amplification branches such that the circuit arrangement is operative as an out-phasing amplifier arrangement; and a phase modulating unit configured to provide a digital clock signal, which is phase modulated in accordance with the phase information of the RF input signal, and to up-convert the basic frequency of the clock signal by a predetermined binary factor;

an out-phasing signals generation unit receiving the up-converted clock signal and a digital control signal and configured to create at least two copies of the phase modulated clock signal with a selected phase shift in accordance with the digital control signal as basic signals for a respective one of the first and second out-phasing signal;

to selectively swallow pulses in each copy of the clock signal in accordance with the digital control signal during a division operation for down-converting the frequency by the predetermined binary factor so that a determined delay in each copy of the clock signal is effected; and to multiply the two copies of the clock signal to produce of one of the first and second out-phased signals.

4. RF power amplifier circuit arrangement according to claim 3, further comprising: an signal component separation unit arranged for generating the digital control signal based on the amplitude information of the RF input signal and to provide a phase information of the RF input signal to the phase modulating unit.

5. Circuit arrangement according to claim 3, wherein the out-phasing signals generation unit is further configured to create four phase shifted copies of the phase modulated clock signal, and to swallow selectively pulses in each copy of the clock signal in accordance with the digital control signal during the division operation for down-converting the frequency by the predetermined binary factor and synchronously in a respective first and second set comprising respective two of the four phase shifted copies of the phase modulated digital signal, and wherein the out-phasing signals generation unit further comprises a first and second interpolating unit receiving respectively the down-converted first and second set of the phase modulated clock signals, wherein each interpolating unit is configured to output one respective interpolated clock signal for production of one of the first and second out-phased signals, and wherein the out-phasing signals generation unit is further configured to combine respective two interpolated clock signals to produce one of the first and second out-phased signal.

6. Circuit arrangement according to claim 3, wherein the out-phasing signals generation unit further comprises a logic operation unit for implementing the combination of respective two interpolated clock signals to produce one of the first and second out-phased signal by means a binary multiplication.

7. Circuit arrangement according to claim 3, wherein the out-phasing signals generation unit comprises a first binary circuit element, optionally, a Flip-Flop element, which is configured to receive the digital control signal and the digital clock signal, which is phase modulated in accordance with the phase information of the RF input signal, from the phase modulating unit, and which is further configured to provide the copies of the digital clock signal with a selectable phase shift in accordance with the digital control signal.

8. Circuit arrangement according to claim 3, wherein the out-phasing signals generation unit comprises a signal path for each copy of the clock signal a digital circuitry comprised of cascaded binary circuit elements, optionally, Flip-Flop elements, configured and connected for implementing the swallowing of pulses and the division operation for down-converting the frequency by the predetermined binary factor.

9. Circuit arrangement according to claim 3, wherein the first and second amplification devices comprise a circuit configuration to be operative as switching-mode power amplifiers in one of class-D, class-DE, class-E, class-F, or class-E/F mode.

10. Radio transmitter device comprising a circuit arrangement according to claim 4 for a system in which wide-band complex envelope signals are processed, optionally, EDGE, UMTS using WCDMA modulation, HSxPA, WiMAX using OFDM modulation, and 3G-LTE using OFDM modulation.

* * * * *